US006774301B1

(12) United States Patent
Kordes et al.

(10) Patent No.: US 6,774,301 B1
(45) Date of Patent: Aug. 10, 2004

(54) ELECTROMAGNETIC INTERFERENCE GASKET

(75) Inventors: Kurt Arthur Kordes, Pleasanton, CA (US); Gary Lynn Myers, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/288,810

(22) Filed: Nov. 5, 2002

(51) Int. Cl.[7] .............................................. H05K 9/00
(52) U.S. Cl. .............................. 174/35 GC; 439/927; 277/920
(58) Field of Search .......................... 174/35 GC, 35 R; 361/800, 816, 818; 439/609, 927; 277/228, 229, 235 R, 920

(56) References Cited

U.S. PATENT DOCUMENTS

| | | | | |
|---|---|---|---|---|
| 5,511,798 A | * | 4/1996 | Kawamoto et al. | ......... 277/647 |
| 6,061,249 A | * | 5/2000 | Nealis | ......................... 361/785 |
| 6,359,214 B1 | * | 3/2002 | Worley et al. | ......... 174/35 GC |
| 6,534,706 B1 | * | 3/2003 | Rapp et al. | ............ 174/35 GC |

OTHER PUBLICATIONS

Laird Technologies, "FINGERSTOCK—All–Purpose Gaskets," www.lairdtech.com, 2001, pp. 1–2.
Laird Technologies, "FINGERSTOCK—Slot Mount Series," www.lairdtech.com, 2001, pp. 1–4.
Laird Technologies, "FINGERSTOCK—Dot 10," www.lairdtech.com, 2001, pp. 1–2.
Laird Technologies, "FINGERSTOCK—Solid Top Symmetrical Slotted Shielding," www.lairdtech.com, 2001, pp. 1–2.
Laird Technologies, "FINGERSTOCK—Symmetrical Slotted Shielding (S3)," www.lairdtech.com, 2001, pp. 1–2.
Laird Technologies, "FINGERSTOCK—Variable Slot Mount Series," www.lairdtech.com, 2001, pp. 1–2.
Chomerics, "FINGERSTOCK, Spring–Line® Beryllium–Copper Gaskets," Oct. 2002, pp. 1–10.
Tech–Etch, "EMI/RFI Shielding, Shielding Products" undated, www.tech–etch.com/shield/shielding.html, 4 pages.
Tech–Etch, "375CXXX, Strip Gaskets," undated, www.tech–etch.com/shield/shielding.html, 1 page.
Tech–Etch, "250M42CXXX, No–Snag Fingers," undated, www.tech–etch.com/shield/shielding.html, 1 page.
Tech–Etch, "93S32, SYMMETRICAL; TR32, TRACK," undated, www.tech–etch.com/shield/shielding.html, 1 page.
Tech–Etch, "60P21, Soft No–Snag Fingers," undated, www.tech–etch.com/shield/shielding.html, 1 page.
Tech–Etch, "156M32, No–Snag Fingers," undated, www.tech–etch.com/shield/shielding.hmtl, 1 page.
Tech–Etch, "187V32FXx (Shown with pattern F11), Variable Snap–on Gaskets," undated, www.tech–etch.com/shield/shielding.html, 2 pages.

* cited by examiner

*Primary Examiner*—Dean A. Reichard
*Assistant Examiner*—Carmelo Oliva
(74) *Attorney, Agent, or Firm*—Hickman Palermo Truong & Becker LLP

(57) ABSTRACT

A gasket comprises an edge, a first end and a second end bounding the edge, and a plurality of slits spaced between the first and second ends. At least some of the slits are at one or more oblique angles to the edge. Therefore, a reduced risk of snagging is present when mating one gasket with another with a sliding motion. A method for installing a first electronic device adjacent to a second electronic device comprises coupling a first gasket to the first electronic device and coupling a second gasket to the second electronic device. The first device is placed near the second device such that the first and second gaskets contact with a sliding motion. When in contact, the slits of the first gasket are not parallel with the slits of the second gasket.

23 Claims, 5 Drawing Sheets

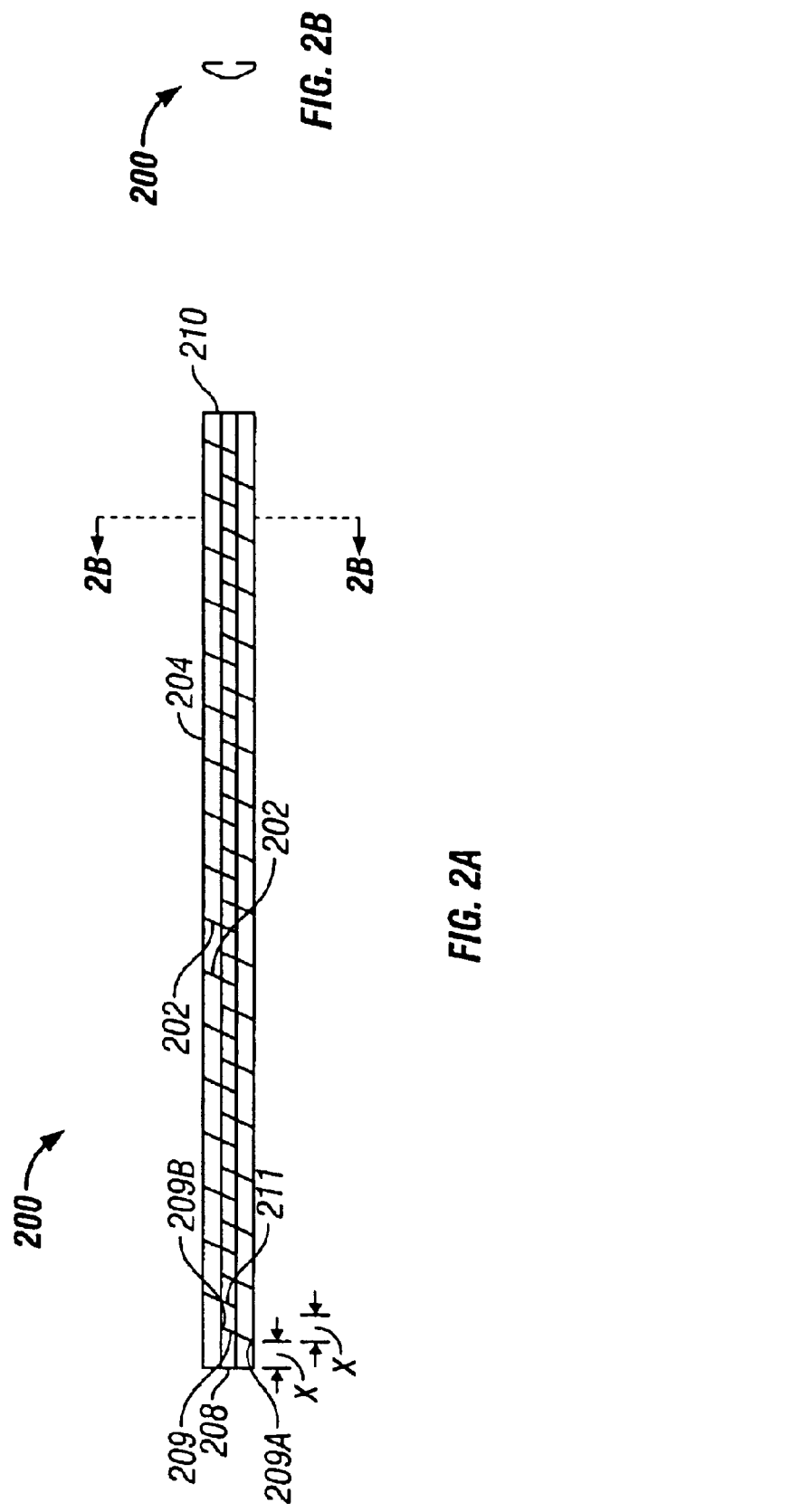

```
┌─────────────────────────────────────────────────────┐
│   COUPLE A FIRST GASKET TO A FIRST ELECTRONIC       │
│ DEVICE (FIRST GASKET HAS FIRST AND SECOND ENDS, AN  │
│ EDGE TRANSVERSE TO THE DEVICE, AND A PLURALITY OF   │
│   SLITS SPACED BETWEEN THE FIRST AND SECOND ENDS    │
│          AND AT AN OBLIQUE ANGLE TO THE EDGE)       │
│                         302                         │
└─────────────────────────────────────────────────────┘
                            │
                            ▼
┌─────────────────────────────────────────────────────┐
│   COUPLE A SECOND GASKET TO A SECOND ELECTRONIC     │
│  DEVICE (SECOND GASKET HAS FIRST AND SECOND ENDS,   │
│  AN EDGE TRANSVERSE TO THE DEVICE, AND A PLURALITY  │
│  OF SLITS SPACED BETWEEN THE FIRST AND SECOND ENDS  │
│          AND AT AN OBLIQUE ANGLE TO THE EDGE)       │
│                         304                         │
└─────────────────────────────────────────────────────┘
                            │
                            ▼
┌─────────────────────────────────────────────────────┐
│       PLACE THE FIRST ELECTRONIC DEVICE NEAR THE    │
│    SECOND ELECTRONIC DEVICE SUCH THAT THE FIRST     │
│      GASKET CONTACTS THE SECOND GASKET WITH A       │
│    SLIDING MOTION (SOME OF THE SLITS OF THE FIRST   │
│   GASKET ARE NOT PARALLEL TO SOME OF THE SLITS OF   │
│    THE SECOND GASKET WHEN THE FIRST GASKET IS IN    │
│             CONTACT WITH THE SECOND GASKET)         │
│                         306                         │
└─────────────────────────────────────────────────────┘
```

*Fig. 3*

ELECTROMAGNETIC INTERFERENCE GASKET

FIELD OF THE INVENTION

The present invention generally relates to protection of electronic equipment. The invention relates more specifically to an electromagnetic interference (EMI) gasket for electronic equipment such as a printed circuit board carrier.

BACKGROUND OF THE INVENTION

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section.

Electromagnetic interference (EMI) can disrupt the operation and performance of electrical circuits. EMI affects a circuit when the circuit is in the vicinity of an electromagnetic field in the RF (radio frequency) spectrum. Therefore, printed circuit boards (PCBs), and electronic equipment in general, often require protection from EMI.

A common method of protecting electrical circuitry from EMI relies on installation of an EMI gasket on printed circuit board carriers, housings, equipment chassis, and the like (hereinafter referred to simply as "carriers"). A common gasket used for EMI protection comprises a metal strip with slits oriented parallel to the direction of travel of the carrier when installing it. The slits assist the gasket in complying with irregularities in the sealing surface, as well as making the gasket more physically compliant in general.

FIG. 1 is a top view of an EMI gasket 100 used to protect electronic equipment. Gasket 100 comprises a plurality of slits, all of which are collectively referred to as slits 102, that are perpendicular to edges 104, 106 and parallel to the ends 108, 110 of gasket 100.

Installation configurations for electronic equipment often require stacking PCB carriers on top of each other or closely adjacent to each other. Furthermore, some electronic components require EMI gaskets on both upper and lower surfaces of the component or associated carrier. These EMI and installation requirements can result in a situation in which the bottom gasket of one carrier must mate with and seal against the top gasket of a neighboring or adjacent carrier.

In such a scenario, when using gaskets configured like gasket 100, the mating gaskets frequently snag on each other during installation and removal, due to the slit configuration. Typically, when mating gaskets snag on each other, one or both of the gaskets are damaged, thereby creating an unacceptable assembly.

Based on the foregoing, there is a clear need for an improved mechanism for controlling electromagnetic interference with respect to electrical circuits or printed circuit boards. There is a more specific need for an improved gasket that is able to be installed and seal with another gasket without snagging.

BRIEF DESCRIPTION OF THE DRAWINGS

The present invention is illustrated by way of example, and not by way of limitation, in the figures of the accompanying drawings and in which like reference numerals refer to similar elements and in which:

FIG. 2A is a top plan view of a gasket;

FIG. 2B is a section elevation view of a gasket taken along line 2B—2B of FIG. 2A;

FIG. 3 is a flowchart that illustrates a process for installing an electronic device adjacent to another electronic device;

DETAILED DESCRIPTION

Figure 1:
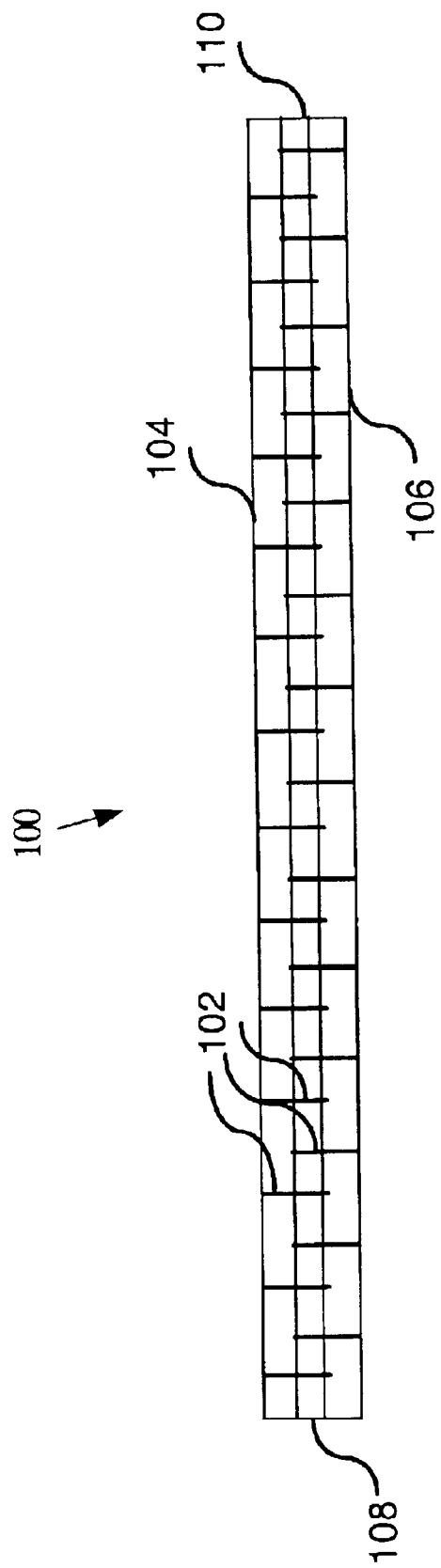
FIG. 1 is a top plan view of an EMI gasket used to protect electronic equipment.

An electromagnetic interference gasket is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Overview

In one aspect, a gasket comprises a first end and a second end bounding an edge, and a plurality of slits spaced between the first and second ends and at an oblique angle to the edge.

In a gasket system, gaskets can be coupled to top and bottom surfaces of, for example, printed circuit board carriers, to affect electromagnetic energy that might otherwise interfere with a circuit. Having slits at an oblique angle allows for installing carriers on top of each other, thereby physically mating two gaskets. Thus, the risk of snagging the gaskets on one another is reduced because the slits from respective gaskets will intersect rather than coincide.

Other aspects of the invention include an EMI prevention gasket and methods of using and manufacturing gaskets.

No-snag Gasket

FIG. 2A is a top view of a gasket 200. FIG. 2B is a side view of the gasket 200.

Gasket 200 comprises an edge 204 bounded by a first end 208 and a second end 210. Although the top edge is depicted as edge 204 in FIG. 2A, either edge of gasket 200 can be referred to as edge 204. Gasket 200 further comprises a plurality of slits 202 that are spaced apart and that are arranged between the first end 208 and the second end 210. Slits 202 collectively refers to any number of slits of gasket 200.

Significantly, at least some of the slits 202 are at an oblique angle to the edge 204. In this context, the term "oblique" means neither perpendicular nor parallel. As depicted in FIG. 2A, as an example, all of the slits 202 are shown at an angle oblique to edge 204. However, gasket 200 may be implemented with some slits perpendicular to edge 204.

In one embodiment, the oblique angle between edge 204 and slits 202 is in the range of 74–106 degrees from edge 204. However, the invention is not limited to oblique angles in the described range. In one embodiment, slits 202 are parallel to each other, as depicted in FIG. 2A; however, one or more slits may be non-parallel.

In one embodiment, gasket 200 is coupled to a printed circuit board (PCB) carrier. Hence, gasket 200 provides a seal for the PCB. In another embodiment, gasket 200 is configured to affect EMI associated with a PCB. As such, gasket 200 can protect the PCB from entry or exit of electromagnetic energy. For example, in one implementation, gasket 200 is installed on a PCB carrier that is coupled to a chassis, and the gasket 200 is configured to prevent EMI from exiting the chassis. Hence, neighboring PCBs or electronic components are protected from electromagnetic energy generated by components housed within the chassis.

In one embodiment, gasket 200 comprises a three-dimensionally shaped metal sheet. For example, FIG. 2B illustrates a possible shape to which gasket 200 can be configured, resulting in an approximately "C" shaped cross-section. However, the invention is not limited to the shape illustrated in FIG. 2B, or to any other shape. In implementations for protection associated with EMI, gasket 200 can be manufactured from a sheet of conductive material, for example, a copper alloy or other metal. Furthermore, implementations of gasket 200 may comprise a plating of tin.

In one embodiment, the plurality of slits 202 includes a first end slit 209 that is adjacent to the first end 208 and an adjacent slit 211 that is adjacent to and parallel to the first end slit 209. The first end slit 209 has an initial end 209A and a terminal end 209B. The initial end 209A of first end slit 209 is at a distance X from first end 208, wherein X is equal to the distance between the adjacent slit 211 and the first end slit 209 when measured parallel to edge 204. The value of X is not critical and can be any desired distance. Such a configuration for gasket 200 provides mechanical strength at the ends of gasket 200 for installation and life-cycle reliability purposes, for example.

According to one aspect of the invention, a gasket system for affecting EMI comprises a first gasket, such as gasket 200, coupled to a first device and a second gasket, such as gasket 200, coupled to a second device. Each of the first and second gaskets comprises respective pluralities of slits at an oblique angle to their respective edges or lengths. The angle of the slits of the first gasket may be equal to or different from the angle of the slits of the second gasket. Further in relation to the gasket system, upon positioning the first gasket in contact with the second gasket, the plurality of slits of the first gasket are not parallel to the plurality of slits of the second gasket. Thus, the first and second gaskets are less likely to snag on each other when positioning the first and second devices adjacent to each other.

In one embodiment of the gasket system, upon positioning the first gasket in contact with the second gasket, at least some of the slits of the first gasket intersect with at least some of the slits of the second gasket. This occurs when the angle of the slits of the first gasket, in relation to an edge such as edge 204, are in the same quadrant as the angle of the slits of the second gasket, in relation to an edge such as edge 204. In another embodiment of the gasket system, the first and second devices are PCB carriers.

Process for Installing an Electronic Device Adjacent to Another Electronic Device FIG. 3 is a flowchart that illustrates a process for installing an electronic device adjacent to another electronic device.

At block 302, a first gasket is coupled to a first electronic device. The first gasket includes a first end, a second end, and an edge that is transverse to the first electronic device. Further, each of the first and second ends bound the edge. Still further, the first gasket includes a plurality of slits spaced between the first and second ends, at least some of which are at one or more oblique angles to the edge. For example, gasket 200 is coupled to a surface of a PCB carrier, such as a top, bottom or side surface.

At block 304, a second gasket is coupled to a second electronic device. The second gasket is similar to the first gasket in that it includes a first end, a second end, and an edge that is transverse to the second electronic device. Further, each of the first and second ends bound the edge. Still further, the second gasket includes a plurality of slits spaced between the first and second ends, at least some of which are at one or more oblique angles to the edge. For example, gasket 200 is coupled to a surface of a PCB carrier, such as a top, bottom or side surface.

At block 306, the first electronic device is placed near the second electronic device such that the first gasket contacts the second gasket with a sliding motion. For example, the first gasket may be coupled to the top surface of a first PCB carrier and the second gasket may be coupled to the bottom surface of a second PCB carrier.

Figure 4B:
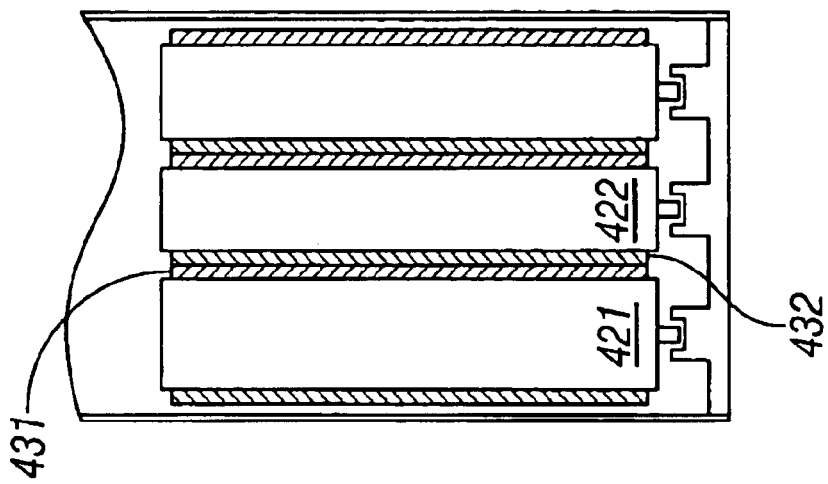
FIG. 4B is a diagram that illustrates a horizontally adjacent installation of electronic devices coupled with gaskets.
Figure 4A:
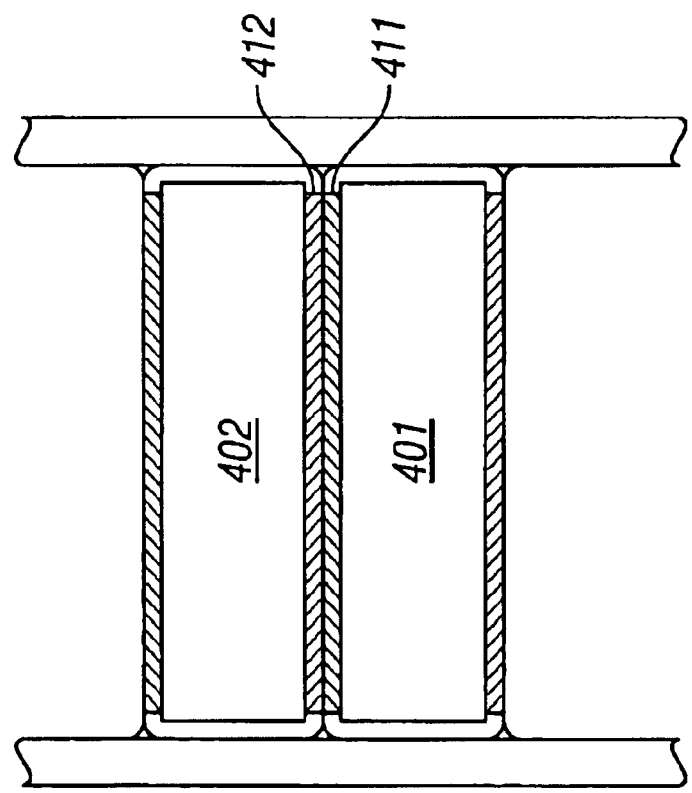
FIG. 4A is a diagram that illustrates a vertically adjacent installation of electronic devices coupled with gaskets.

FIG. 4A is a diagram that illustrates a vertically adjacent installation of electronic devices coupled with gaskets. In a vertically adjacent installation, such as with a conventional slots within an electronic component, the second device 402 is installed on top of the first device 401 by sliding the second device 402 over first device 401, which causes sliding contact between the first gasket 411 and the second gasket 412.

For another example, the first gasket may be coupled to the right-side surface of a first PCB carrier and the second gasket may be coupled to the left-side surface of a second PCB carrier. FIG. 4B is a diagram that illustrates a horizontally adjacent installation of electronic devices coupled with gaskets. In a horizontally adjacent installation, in which the devices are installed side-by-side (e.g., each device is taller than it is wide), the second device 422 is installed next to the first device 421 by sliding the second device 422 next to the first device 421, which causes sliding contact between the first gasket 431 and the second gaskets 432. Each carrier may be constituent to a separate electronic component or multiple carriers may be constituent to a single electronic component.

Furthermore, returning to block 306 of FIG. 3, when the first gasket is in contact with the second gasket, some or all of the plurality of slits of the second gasket are not parallel to some or all of the plurality of slits of the first gasket. In fact, the slits are in different quadrants relative to respective mating gasket edges. Hence, the first and second gaskets are less likely to snag on each other when positioning the first and second devices adjacent to each other. In a chassis in which space is limited, the ability to contain EMI by stacking PCB carriers against each other eliminates additional layers of sheet metal in the chassis that normally might be necessary to contain EMI.

Process for Manufacturing a Gasket for Affecting Electromagnetic Energy

Figure 5:
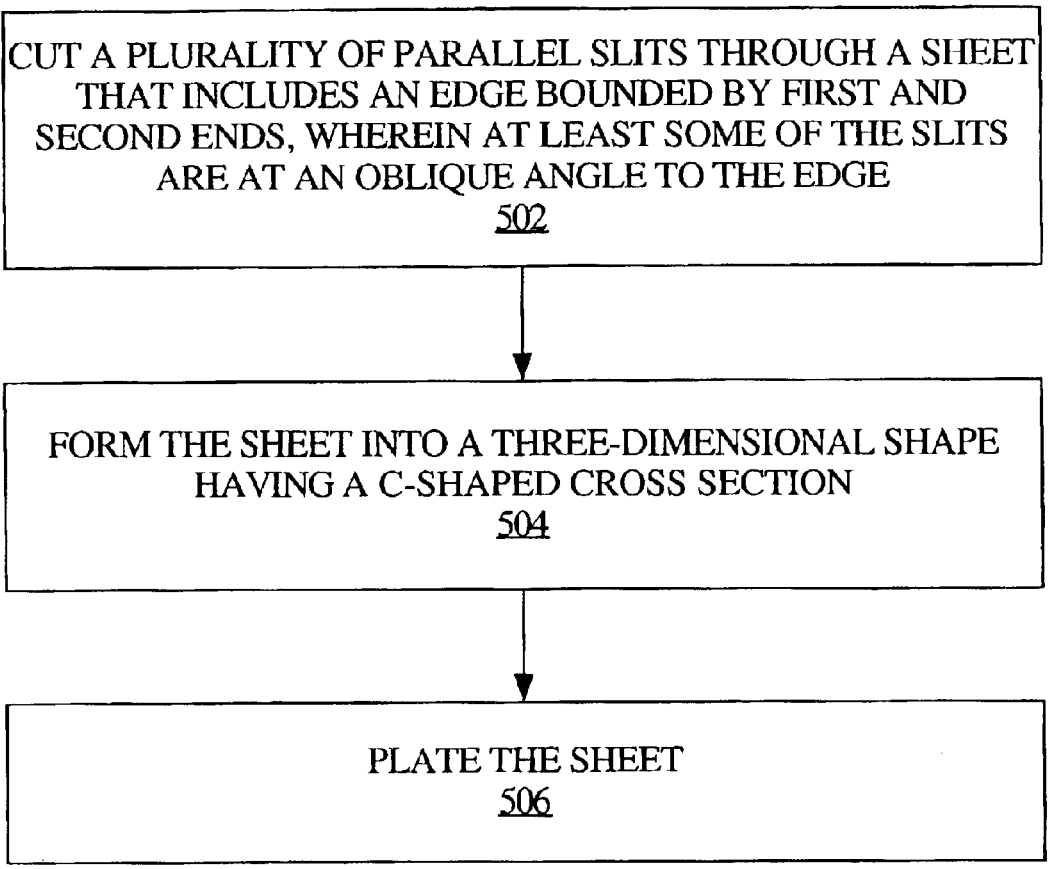
FIG. 5 is a flowchart that illustrates a process for manufacturing a gasket for affecting electromagnetic energy.

FIG. 5 is a flowchart that illustrates a process for manufacturing a gasket for affecting electromagnetic energy. For example, a gasket manufactured according to the process of FIG. 5 can be used to affect electromagnetic interference associated with electrical circuitry.

At block 502, a plurality of slits are cut through a sheet that includes an edge bounded by first and second ends. In an embodiment, the sheet is a sheet of conductive material, such as copper or some other metal. The plurality of slits are at an oblique angle to the edge: At block 504, the sheet is formed into a three-dimensional shape having a C-shaped cross section. The C-shaped cross-section is recognized when the gasket is sectioned between the first and second ends, that is, when the gasket is cut from edge to edge across its smaller dimension.

FIG. 2A and FIG. 2B depict a gasket 200 that could be manufactured using the process of FIG. 5. FIG. 2B illustrates an example of a C-shaped cross section, as formed according to block 504.

In an embodiment, the plurality of slits are parallel to each other. Therefore, the oblique angle is equivalent for each of the plurality of slits. In another embodiment, the step of cutting the slits, block 502, includes cutting each slit equidistant from an adjacent slit. In yet another embodiment, the step of cutting the slits, block 502, includes cutting each slit at an angle in a range between 74 degrees and 106 degrees, measured from the edge.

At optional block 506, the sheet is plated. For example, the sheet may be plated with tin or some other finish material. This step provides a finish for the gasket manufactured according to the process of FIG. 5.

What is claimed is:

1. A gasket, comprising:
   an edge;
   a first end and a second end, each of the first end and the second end bounding the edge and forming an outer border of the gasket;
   a plurality of linear slits spaced between the first end and the second end, wherein at least some of the plurality of slits are at one or more oblique angles to the edge.

2. The gasket of claim 1, wherein the plurality of slits are substantially parallel.

3. The gasket of claim 1, wherein the gasket is coupled to a printed circuit board carrier.

4. The gasket of claim 1, wherein the gasket is coupled to a printed circuit board carrier in a position that affects electromagnetic interference associated with the printed circuit board.

5. The gasket of claim 4, wherein the printed circuit board carrier is coupled with a chassis, and wherein the gasket is coupled to a printed circuit board carrier in a position that substantially prevents electromagnetic interference from exiting the chassis.

6. The gasket of claim 1, wherein the gasket comprises a three-dimensionally shaped metal sheet.

7. The gasket of claim 6,
   wherein the plurality of slits includes
      a first end slit that is adjacent to the first end, the first end slit having an initial end and a terminal end, and
      an adjacent slit that is adjacent to and substantially parallel to the first end slit,
   wherein the initial end of the first end slit is at a distance from the first end, the distance being equal to or greater than a distance between the adjacent slit and the first end slit measured parallel to the edge.

8. The gasket of claim 1, wherein the one or more angles are from 74 degrees and 106 degrees.

9. An electromagnetic interference gasket, comprising:
   an elongated conductive sheet having an elongated edge, a first end and a second end that form an outer border of the gasket; and
   a plurality of linear slits in the sheet, wherein the slits are spaced apart and disposed between the first end and the second end, and wherein the slits are disposed at one or more oblique angles with respect to the elongated edge.

10. A gasket system for affecting electromagnetic interference, the gasket system comprising:
   a first gasket having a first length and a first plurality of slits spaced along the first length, wherein some of the plurality of slits are at a first angle oblique to the first length, and wherein the first gasket is coupled to a first device; and
   a second gasket having a second length and a second plurality of slits spaced along the second length, wherein some of the plurality of slits are at a second angle oblique to the second length, and wherein the second gasket is coupled to a second device;
   wherein, upon positioning the first gasket in contact with the second gasket, the first plurality of slits are not parallel to the second plurality of slits.

11. The system of claim 10, wherein, upon positioning the first gasket in contact with the second gasket, at least a portion of the first plurality of slits intersects with at least a portion of the second plurality of slits.

12. The system of claim 10, wherein the first and second devices are printed circuit board carriers.

13. The system of claim 10, wherein the first angle of the first gasket and the second angle of the second gasket are equal.

14. A method for installing a first electronic device adjacent to a second electronic device, comprising the steps of:
   coupling a first gasket to a surface of the first electronic device, wherein the first gasket includes a first end, a second end, and an edge that is transverse to the first electronic device, each of the first end and the second end of the first gasket bound the edge, and wherein the first gasket includes a plurality of slits spaced between the first end and the second end, and wherein at least some of the plurality of slits are at one or more oblique angles to the edge;
   coupling a second gasket to a surface of the second electronic device, wherein the second gasket includes a first end, a second end, and an edge that is transverse to the second electronic device, each of the first end and the second end bounding the edge, and wherein the second gasket includes a plurality of slits spaced between the first end and the second end, and wherein at least some of the plurality of slits are at one or more oblique angles to the edge;
   placing the first electronic device near the second electronic device such that the first gasket contacts the second gasket with a sliding motion;
   wherein some of the plurality of slits of the first gasket are not parallel with some of the plurality of slits of the second gasket when the first gasket is in contact with the second gasket.

15. A method for manufacturing a gasket for affecting electromagnetic energy, the method comprising:
   cutting a plurality of linear slits through a sheet that includes an edge bounded by a first end and a second end that form an outer border of the gasket, wherein at least some of the plurality of slits are at one or more oblique angles to the edge;
   forming the sheet into a three-dimensional shape having a C-shaped cross section when sectioned between the first and second ends.

16. The method of claim 15, wherein the step of cutting the plurality of slits includes cutting the slits substantially parallel.

17. The method of claim 15, wherein the step of cutting the plurality of slits includes cutting each slit equidistant from an adjacent slit.

18. The method of claim 15, wherein the step of cutting the plurality of slits includes cutting each slit at an angle in a range from 74 degrees to 106 degrees.

19. The method of claim 15, further comprising the step of:

plating the sheet.

20. The method of claim 19, wherein the step of plating the sheet includes plating the sheet with a conductive material.

21. The method of claim 15, wherein the step of cutting a sheet includes cutting a sheet of conductive material.

22. The method of claim 15, wherein the step of cutting a sheet includes cutting only a sheet of conductive material.

23. A system for manufacturing a gasket for affecting electromagnetic energy, the system comprising:

means for cutting a plurality of linear slits through a sheet that includes an outer edge bounded by a first end and a second end that form an outer border of the gasket, wherein at least some of the plurality of slits are at one or more oblique angles to the outer edge; and means for forming the sheet into a three-dimensional shape having a C-shaped cross section when sectioned between the first and second ends.

\* \* \* \* \*